United States Patent [19]

Gross, Jr. et al.

[11] Patent Number: 5,731,775
[45] Date of Patent: Mar. 24, 1998

[54] SUBRANGING CONVERTER WITH PLURALITY OF RESISTOR STRINGS AND TRANSISTOR SWITCHES

[75] Inventors: George Francis Gross, Jr., Reading, Pa.; Thayamkulangara Ramaswamy Viswanathan, Addison, Tex.

[73] Assignee: Lucent Technologies Inc., Murray Hill, N.J.

[21] Appl. No.: 664,632

[22] Filed: Jun. 17, 1996

[51] Int. Cl.[6] .................................................. H03M 1/72
[52] U.S. Cl. ........................................... 341/155; 341/156
[58] Field of Search .................................. 341/161, 155, 341/172, 156, 145

[56] References Cited

U.S. PATENT DOCUMENTS

| | | | |
|---|---|---|---|
| 3,816,803 | 6/1974 | Gordon | 320/1 |
| 4,733,217 | 3/1988 | Dingwall | 340/347 |
| 4,763,107 | 8/1988 | Koen et al. | 340/347 |
| 4,804,941 | 2/1989 | Yoshil | 341/140 |
| 4,876,544 | 10/1989 | Kuraishi | 341/166 |
| 4,894,656 | 1/1990 | Lin | 341/120 |
| 4,903,023 | 2/1990 | Evans et al. | 341/120 |
| 4,924,225 | 5/1990 | Dingwall et al. | 341/118 |
| 4,947,168 | 8/1990 | Myers | 341/120 |
| 4,984,974 | 1/1991 | Mijuskovic | 341/156 |
| 5,027,116 | 6/1991 | Armstrong et al. | 341/120 |
| 5,070,332 | 12/1991 | Kaller et al. | 341/156 |
| 5,134,399 | 7/1992 | Hiller | 341/131 |
| 5,223,836 | 6/1993 | Komatsu | 341/156 |
| 5,248,973 | 9/1993 | Babu et al. | 341/156 |
| 5,495,245 | 2/1996 | Ashe | 341/145 |
| 5,581,255 | 12/1996 | Hsu | 341/156 |
| 5,619,203 | 4/1997 | Gross et al. | 341/144 |

OTHER PUBLICATIONS

"Analog–Digital Conversion Handbook", Third Edition, by the Engineering Staff of Analog Devices, Inc., published by Prentice–Hall, Englewood Cliffs, NJ 07632, Edited by Daniel H. Sheingold, 1986, pp. 218–219, 355, 420–426.

*Primary Examiner*—Jeffrey A. Gaffin
*Assistant Examiner*—Peguy JeanPierre
*Attorney, Agent, or Firm*—David L. Smith

[57] ABSTRACT

There is disclosed an integrated circuit including a resistor string comprising a plurality of resistors. The resistor string includes a first array of resistors for determining a predetermined number, M, of most significant bits, and a second array of resistors for determining a predetermined number, L, of least significant bits. Each of the first and second arrays of resistors define intermediate taps. First and second arrays of switching transistors are coupled to the respective taps in respective first and second arrays of resistors. Switches in the first array of switching transistors are coupled between a respective intermediate tap in the first array of resistors and a first output node. Transistors in a second array of switching transistors are coupled between a respective intermediate tap in the second array of resistors and a second output node. A selection circuit coupled to a terminal of each switching transistor in a first array and a second array selectively switches the state of switching transistors. The selection circuit is capable of switching the state, such as switching to the on state, of at least one transistor in the first array and at least one transistor in the second array. The voltage developed between the first and second nodes is the output voltage.

17 Claims, 4 Drawing Sheets

SUBRANGING CONVERTER WITH PLURALITY OF RESISTOR STRINGS AND TRANSISTOR SWITCHES

TECHNICAL FIELD

This application relates generally to converters such as analog-to-digital converters (ADC) and digital-to-analog converters (DAC), and more particularly to such converters that include subranging to achieve a greater number of bits of conversion.

BACKGROUND OF THE INVENTION

DACs are used to convert a digitally coded signal to an analog signal, or in conjunction with successive approximation circuitry as part of an analog-to-digital converter. In DACs that employ a resistor string, switches, such as transistors, couple intermediate taps at the resistor junctions, as well as at the resistor-power source junctions, to an output node. The number of resistor string resistors required to provide an n-bit converter is $2^n-1$. Thus, for each additional bit to be converted the number of tap switches and resistors substantially doubles. In VLSI technology, resistors may be fabricated at a predetermined level of integrated circuit fabrication. Doubling the number of resistors and tap switches to obtain an additional bit of conversion approximately doubles the area of the converter and increases the area and power dissipation of the decoder, and thus is costly. What is desired is a subranging converter using a technique that results in an additional bit or additional bits of conversion but does not require doubling the number of resistors and tap switches, and hence silicon area of resistors and tap switches, for each additional bit of conversion.

SUMMARY OF THE INVENTION

In accordance with an illustrative embodiment of the present invention, an integrated circuit includes a resistor string comprising a plurality of resistors. The resistor string includes a first array of resistors for determining a predetermined number, M, of most significant bits, and a second array of resistors for determining a predetermined number, L, of least significant bits. Each of the first and second arrays of resistors define intermediate taps. First and second arrays of switching transistors are coupled to the respective taps in respective first and second arrays of resistors. Switches in the first array of switching transistors are coupled between a respective intermediate tap in the first array of resistors and a first output node. Transistors in a second array of switching transistors are coupled between a respective intermediate tap in the second array of resistors and a second output node. A selection circuit coupled to a terminal of each switching transistor in a first array and a second array selectively switches the state of switching transistors. The selection circuit is capable of switching the state, such as switching to the on state, of at least one transistor in the first array and at least one transistor in the second array. The voltage developed between the first and second nodes is the output voltage.

DETAILED DESCRIPTION

Figure 1:
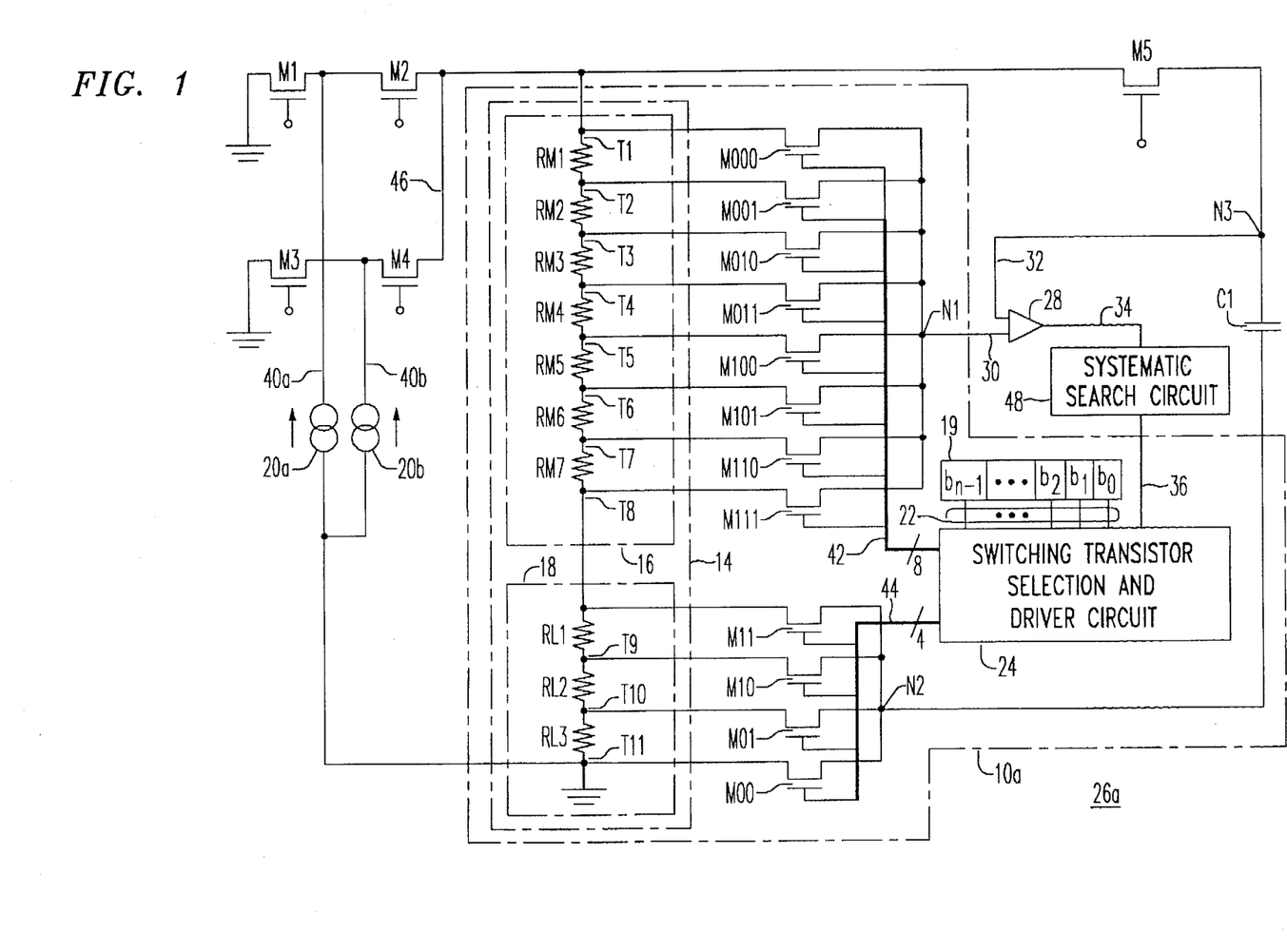
FIG. 1 is a schematic diagram of a portion of a current source driven analog-to-digital converter in accordance with an illustrative embodiment of the present invention.
Figure 2:
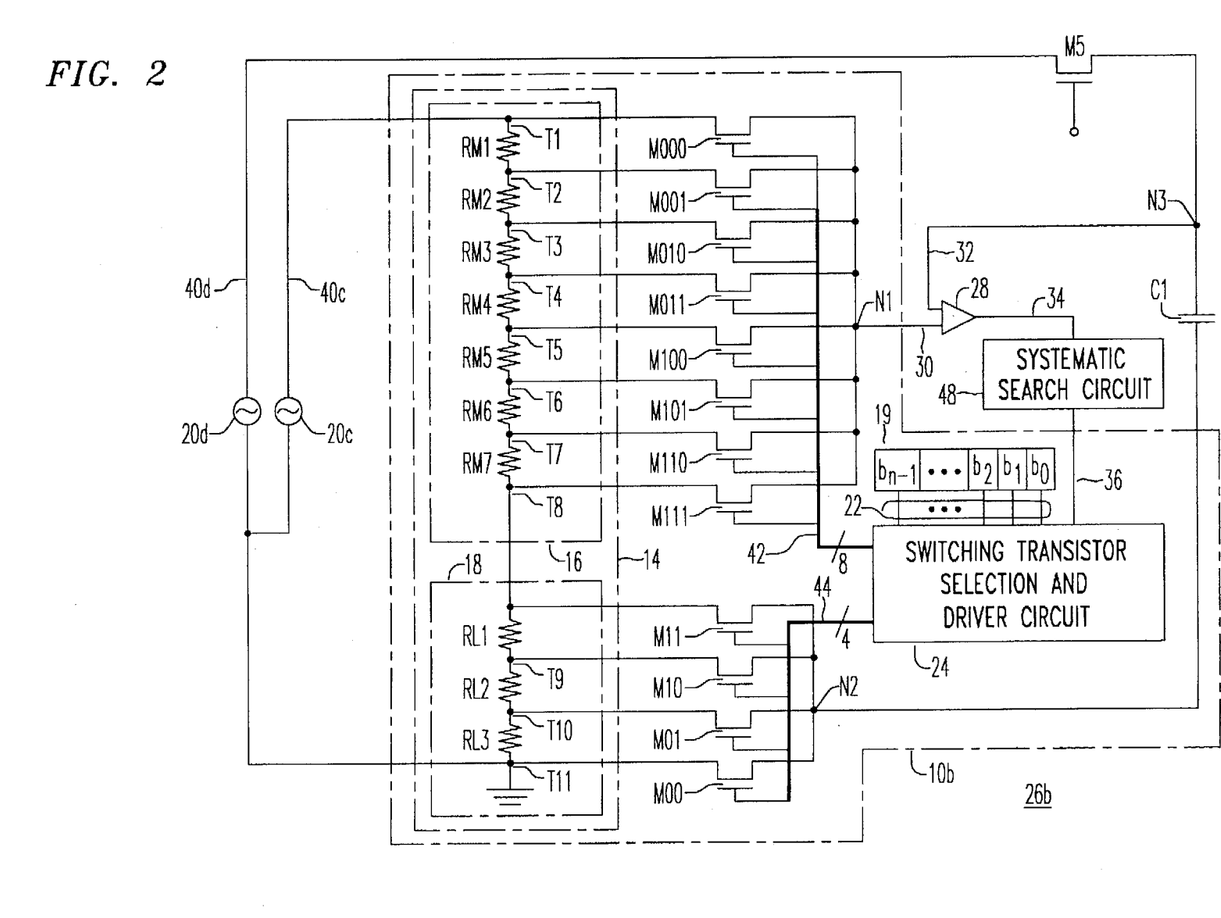
FIG. 2 is a schematic diagram of a portion of an analog-to-digital converter similar to the converter shown in FIG. 1, driven by a voltage source.

The schematic diagram of an ADC 26, incorporating a DAC 10, in accordance with the present invention is shown in the figures. ADC 26 is shown in a single-ended mode in FIGS. 1 and 2. FIG. 1 shows a current driven converter, whereas FIG. 2 shows a voltage driven converter. ADC 26 incorporates a resistor string of serially coupled resistors. The resistor string includes a first array of resistors for determining a predetermined number, M, of most significant bits, and a second array of resistors for determining a predetermined number, L, of least significant bits. Switches, shown as MOS transistors, couple intermediate taps in the first array of resistors in the resistor string to a first node. Switches also couple intermediate taps in the second array of resistors in the resistor string to a second node. The magnitude of a differential analog voltage developed between the first and second nodes depends on the state of the switches. DAC 10 operates in conjunction with other circuitry to form ADC 26.

An illustrative embodiment of the invention will be described in which a five bit converter, including two bits of subranging, is illustrated. The more general case will be evident from the disclosure. The choice of how many bits are subranged is user-determined. In the illustrative embodiment, the converter will be described as having one switching transistor associated with a first array of resistors and one switching transistor associated with a second array of resistors switched to be in the on state. The invention, however, is not limited thereto.

With reference to FIG. 1, resistor string 14 is comprised of a user-determined number of resistors. The resistors are divided into a first array of resistors 16 (also referred to below as the most significant bit array of resistors, or MSB array), including resistors denoted RM1–RM7 in the illustrative embodiment, and a second array of resistors 18 (also referred to below as the least significant bit array of resistors, or LSB array), including resistors denoted RL1–RL3.

The total number of resistors required, and therefore a measure of the silicon area required for fabrication, is a function of where the M-to-L array split occurs and can be defined as follows:

$$R_T = R_{MSB} + R_{LSB}$$

$$R_T = (2^M - 1) + (2^L - 1)$$

$$R_T = 2^M + 2^L - 2$$

where: n, the number of bits being converted, is M+L $R_T$ is the total number of resistors $R_{MSB}$ is the number of resistors in the MSB resistor array $R_{LSB}$ is the number of resistors in the LSB resistor array The total number of resistors is at a minimum when M=L. However, other factors, beyond silicon area required for fabrication, such as resistor matching and scaling to achieve the required differential linearity must also be considered and often the chosen M-to-L array split will not occur at the point of minimum area where M=L.

Resistor string 14 is coupled to a power source, such as a reference current source 20a which provides a known constant current 40a to resistor string 14 when DAC 10 is employed as a stand-alone digital-to-analog converter, or when DAC 10 is incorporated in an analog-to-digital converter 26a as shown in FIG. 1. The resistance values of the resistors comprising resistor string 14 are application dependent and can be readily selected by one skilled in the art based on a variety of parameters such as the power to be dissipated, the potential across or developed across the resistor string, the number of resistors in the resistor string, the number of bits of the converter, and the number of bits in the subranging portion of the converter.

At the resistor junctions in the first array of resistor 16, as well as the power source-resistor junction, a switch is coupled between the junction and a node such as node N1. The junctions define intermediate taps T1 through T8. The switches associated with the first array of resistors, preferably transistors, are shown in the illustrative embodiment as MOS transistors M000 through M111. Transistors M000 through M111 each couple an intermediate tap, T1 through T8, respectively, with node N1, with each transistor having its source and drain coupled between node N1 and a respective intermediate tap. The switching transistors M000 through M111 have their gate terminals coupled to switching transistor selection and driver circuit 24 via bus 42 and are typically identical.

Similarly, at the resistor junctions in the second array of resistors 18 as well as at the power source-resistor junction, a switch is coupled between the junction and a node such as node N2, with each transistor having its source and drain coupled between node N2 and a respective intermediate tap. The junctions define additional intermediate taps T9 through T11. Intermediate tap T8 is common to both the first array of resistors 16 and the second array of resistors 18. The switches associated with the second array of resistors, preferably transistors, are shown in the illustrative embodiment as MOS transistors M00 through M11. Transistors M11 through M00 each couple an intermediate tap T8 through T11, respectively, with node N2, with each transistor having its source and drain coupled between node N2 and a respective intermediate tap. The switching transistors M11 through M00 have their gate terminals coupled to switching transistor selection and driver circuit 24 via bus 44 and are typically identical.

While the gate terminals of switching transistors associated with first array of resistors 16, and the gate terminals of switching transistors associated with second array of resistors 18 are shown coupled to the same switching transistor selection and driver circuit 24, it is recognized that more than one switching transistor selection and driver circuit could be used. For example, separate switching transistor selection and driver circuits could be employed to control the switching transistors associated with each array of resistors, to control smaller groups of transistors or resistors, or a circuit could be employed to control each transistor.

The outputs of DAC 10, presented at nodes N1 and N2, are differential voltages. These voltages can be combined by those skilled in the art by known switch-capacitor techniques to provide a single-ended DAC output, which is not shown. This, however, is not required when the circuit shown in FIG. 1 is operated as an ADC.

Comparator 28 has a first input 30 coupled to node N1, a second input 32 coupled to node N3, and an output 34. Output 34 is coupled as an input to systematic search circuit 48. The output 36 of systematic search circuit 48 provides an input to switching transistor selection and driver circuit 24. Capacitor C1 is coupled between nodes N2 and N3.

The example shown in FIGS. 1 and 2 is a five bit converter. DAC 10 is a five bit digital-to-analog converter, with two bits of subranging. ADC 26 is a five bit analog-to-digital converter capable of converting an incoming analog signal to a five bit digitally encoded representation. The binary form may be one of any known convention, for example, binary, twos-complement, or sign-magnitude.

Absent subranging, the number of equal resistance resistors required for a five bit converter is $2^5-1$ or 31 resistors. A resistor string having 31 equal resistance resistors would have approximately 3.2 percent of the voltage developed across the resistor string across each resistor. Subranging two of the five bits (more generally L-bits) leaves three (more generally M) of the most significant bits to be determined using the most significant bit array of resistors 16. By subranging two bits, only $2^M-1$ or 7 resistors are required to convert the three most significant bits. The seven resistors, RM1 through RM7, are each four (more generally $2^L$) times the resistance of each of resistors RL1–RL3 so the total resistance is the same as if resistor string 14 were comprised of $(2^{(M+L)}-1)$ or 31 equal resistance resistors. To convert the two least significant bits, $2^L-1$ resistors or in the illustrative embodiment, 3 resistors are required in the least significant bit array of resistors 18.

For a voltage V developed across resistor string 14, the voltage developed at each intermediate tap for the five bit, subranging two bits illustrative embodiment of FIGS. 1 and 2, is given in Table I.

TABLE I

| Intermediate Tap | Voltage |
|---|---|
| T1 | (31/31) V |
| T2 | (27/31) V |
| T3 | (23/31) V |
| T4 | (19/31) V |
| T5 | (15/31) V |
| T6 | (11/31) V |
| T7 | (7/31) V |
| T8 | (3/31) V |
| T9 | (2/31) V |
| T10 | (1/31) V |
| T11 | 0 V |

The converters shown in FIG. 2 are similar to the converters shown in FIG. 1, but are driven by a voltage source. In voltage mode, a reference voltage source 20c is applied across resistor string 14. To achieve unity again, the reference voltage 40c from reference voltage source 20c is equal to the maximum expected output signal voltage level (DAC operation) or the maximum expected input signal voltage level (ADC operation). Operation of DAC 10 and ADC 26 in the voltage mode should be readily understood by one skilled in the art in view of the above explanation of operation of DAC 10 and ADC 26 in the current mode. In voltage mode, switching transistors M1 through M4 shown in FIG. 1 are not necessary. The input analog voltage signal 40d to be connected is supplied by reference voltage source 20d. The input analog voltage signal 40d is sampled and held on capacitor C1 by sampling switch M5. In other respects, the converters shown in FIGS. 1 and 2 may be identical, i.e., 26a may be identical to 26b and 10a may be identical to 10b.

Operation of DAC 10 will be described, followed by operation of ADC 26. In operation as a digital-to-analog converter 10, an n-bit $(b_{n-1} \ldots b_2, b_1, b_0)$ digitally encoded input signal 19 representative of the desired analog signal is presented at lines 22. DAC 10 develops an analog voltage signal corresponding to the digitally encoded input signal and presents the analog signal output across capacitor C1. The digitally encoded input signal is provided to a decoding and driver circuit, such as switching transistor selection and driver circuit 24. (Note that the digitally encoded signal 19 is an input with respect to DAC 10 and will be referred to as a digitally encoded output signal 19 with respect to ADC 26.) The decoding circuit decodes the digitally encoded signal and the driver circuit turns on the appropriate switches, to conduct the voltage developed at respective intermediate taps, T1 through T11, to nodes N1 and N2. A single switch, M000 through M111, associated with the first array of resistors and a single switch M00 through M11 associated with the second array of resistors are typically switched to be in the on state simultaneously. Alternatively, multiple switches associated with one or both of the first and second resistor arrays may be switched to be in the on state simultaneously. Switching transistors M000 through M111, are controlled by their gate terminals being coupled to switching transistor selection and driver circuit 24 via bus 42. Switching transistors M00 through M11 are controlled by their gate terminals being coupled to circuit 24 via bus 44. Each switching transistor that is in the on state conducts the voltage at its associated intermediate tap to a respective node N1 or N2. An alternative circuit design could switch the switching transistors to be in the off state. A differential voltage is developed between nodes N1 and N2. A monotonic input-output characteristic, providing a staircase differential voltage between nodes N1 and N2 for increasing digitally encoded input signal 19, is derived from the intermediate taps T1 through T11.

In the current mode shown in FIG. 1, transistors M1, M2, M3 and M4 are used to switch between reference current source 20a providing reference current 40a driving resistor string 14 as a DAC and analog current signal 40b provided by signal current source 20b as an ADC. A reference current 40a drives resistor string 14 by switching transistors M2 and M3 to the on state and transistors M1 and M4 to the off state. Analog current signal 40b is thereby diverted to ground. Operation of transistor M5, together with transistor M00, is coordinated to charge capacitor C1 with the voltage developed across resistor string 14 by the application of analog current signal 40b when the converter is operated as an analog-to-digital converter. Transistor MS, together with capacitor C1, comprises a sample and hold circuit that maintains the voltage developed across resistor string 14 as the positive input to comparator 28 to which a generated voltage will be compared.

In operation as an analog-to-digital converter 26, an analog current signal 40b is received on line 46 with transistors M1, M4, M5 and M00 switched to be in the on state and transistors M2 and M3, as well as transistors M01, M10 and M11, switched to be in the off state. While the illustrative embodiment is described with transistor M00 switched to be in the on state to complete the sample and hold circuit, it is recognized that any of the other switching transistors associated with LSB array 18, or a combination of switching transistors associated with LSB array 18, could be switched to be in the on state with a concomitant change in the sense of comparator 28 output 34 by one skilled in the art. Transistor M1 being in the on state drives current produced by reference current source 20a to ground. The voltage developed across resistor string 14 charges capacitor C1 to develop the sampled analog signal that is being converted to a digitally encoded signal and provides the positive input to comparator 28.

Transistors M1, M4, and M5 are then switched to be in the off state and transistors M2 and M3 are switched to be in the on state. Transistor M3 being in the on state drives analog current signal 40b from signal current source 20b to ground. Transistor M2 being in the on state permits reference current 40a to pass through resistor string 14 to develop a voltage gradient thereacross. Transistor M5 in the off state isolates capacitor C1 and the signal stored thereon from the voltage gradient developed across resistor string 14.

Systematic search circuitry 48 initially turns on an appropriate switching transistor M000 through M111 in the first array of resistors 16, and transistor M00 in the second array of resistors 18 to produce a voltage differential between nodes N1 and N2. The differential voltage developed between nodes N1 and N2 is compared by comparator 28 to the voltage maintained on capacitor C1. Using any systematic search, such as but not limited to successive approximation, various switches M000 through M111 are switched to the on state until a switch is determined that produces a differential voltage across nodes N1 and N2 that is the closest voltage that can be achieved by resistors RM1–RM7 and switches M000 through M111. The "closest" voltage may be slightly greater than or slightly less than the voltage stored on capacitor C1, and is selected dependent on how comparator 28 is operated. The switching transistor that is switched to be in the on state to achieve the closest voltage as described above, determines the M (in the illustrative embodiment, 3) most significant bits of the binary representation.

Once the M most significant bits are determined, the L least significant bits are determined using the subranging portion of ADC 26, resistors RL1–RL3 and switching transistors M00 through M11. The L least significant bits are determined by maintaining the state of the switches M000 through M111 associated with the first array of resistors 16 as determined above, and conducting a systematic search, such as but not limited to successive approximation, of switches M00 through M11 associated with the second array of resistors 18. The search through switches M00 through M11 reduces the difference between the voltage maintained on capacitor C1 and the differential voltage between nodes N1 and N2. As the systematic search couples node N2 to an intermediate tap that is at a higher potential along resistor string 14, the voltage of the lower plate of capacitor C1 is moved to a higher voltage, the voltage on the upper plate of capacitor C1 also moves to a corresponding higher voltage. Concomitantly, increasing the voltage at node N2 and resulting in a smaller differential voltage between the voltage at node N1 (which is maintained constant at this point in the systematic search) and the voltage at node N2. At the end of the search, the switching transistor that is switched to the on state determines the L (in the illustrative embodiment, 2) least significant bits of the binary representation.

Each switch associated with the first array of resistors 16, taken in combination with a switch associated with the second array of resistors 18, when both are switched to be in the on state, provides a unique differential voltage between nodes N1 and N2, and corresponds to a unique concatenated bit binary code of the form M bits followed by L bits. See Table II for one possible representation for the illustrative five bit converter.

TABLE II

| Binary Code | Switch Associated With First Array | Switch Associated With Second Array | Binary Code | Switch Associated With First Array | Switch Associated With Second Array |
|---|---|---|---|---|---|
| 00000 | M111 | M11 | 10000 | M011 | M11 |
| 00001 | M111 | M10 | 10001 | M011 | M10 |
| 00010 | M111 | M01 | 10010 | M011 | M01 |
| 00011 | M111 | M00 | 10011 | M011 | M00 |
| 00100 | M110 | M11 | 10100 | M010 | M11 |
| 00101 | M110 | M10 | 10101 | M010 | M10 |
| 00110 | M110 | M01 | 10110 | M010 | M01 |
| 00111 | M110 | M00 | 10111 | M010 | M00 |
| 01000 | M101 | M11 | 11000 | M001 | M11 |
| 01001 | M101 | M10 | 11001 | M001 | M10 |
| 01010 | M101 | M01 | 11010 | M001 | M01 |
| 01011 | M101 | M00 | 11011 | M001 | M00 |
| 01100 | M100 | M11 | 11100 | M000 | M11 |
| 01101 | M100 | M10 | 11101 | M000 | M10 |
| 01110 | M100 | M01 | 11110 | M000 | M01 |
| 01111 | M100 | M00 | 11111 | M000 | M00 |

The switches that are switched to be in the on state are decoded to produce a digitally encoded output signal 19 that may take any form such as binary, two's complement, or sign magnitude. ADC 26 provides the digitally encoded output signal 19 at lines 22. If the differential nonlinearity worst case of the MSB array is less than an LSB array resistor at its worst case differential non-linearity point, the overall converter can be shown to be monotonic.

To further illustrate DAC10, assume 31 volts is present at tap T1 of resistor string 14. Table III lists the switch combinations that yield the node voltages $V_{N1}$ and $V_{N2}$ and the resulting differential voltages.

For each iteration, the switching transistors in the on state, the comparator output, the voltage at nodes N1, N2 and N3, the digitally encoded output, and the equivalent analog input voltage are listed. For illustrative purposes, the sequence of iterations starts with the two extreme switching transistors in the on state and changes which switching transistors are in the on state to successively approximate the unknown voltage. The "0" for the comparator output indicates the voltage at node N1 is higher than the voltage at node N3, and a "1" for the comparator output indicates the voltage at node N3 is higher than the voltage at node N1.

TABLE IV

| | Iteration | Switching Transistors in on state | | Comparator Output | $V_{N1}$ | $V_{N2}$ | $V_{N3}$ | Digitally Encoded Output | Equivalent Analog Input |
|---|---|---|---|---|---|---|---|---|---|
| MSB's | 1 | M000, | M00 | 0 | 31 | 0 | 17.4 | 11111 | 31 |
| | 2 | M001, | M00 | 0 | 27 | 0 | 17.4 | 11011 | 27 |
| | 3 | M010, | M00 | 0 | 23 | 0 | 17.4 | 10111 | 23 |
| | 4 | M011, | M00 | 0 | 19 | 0 | 17.4 | 10011 | 19 |
| | 5 | M100, | M00 | 1 | 15 | 0 | 17.4 | 01111 | 15 |
| LSB's | 6 | M011, | M01 | 0 | 19 | 1 | 18.4 | 10010 | 18 |
| | 7 | M011, | M10 | 1 | 19 | 2 | 19.4 | 10001 | 17 |
| | 8 | M011, | M11 | 1 | 19 | 3 | 20.4 | 10000 | 16 |
| Reported ADC digitally encoded output | | | | | | | | 10001 | |

TABLE III

| Digital Code | | | | | Switching Transistors in the on state | | $V_{N1}$ | $V_{N2}$ | $(V_{N1} - V_{N2})$ |
|---|---|---|---|---|---|---|---|---|---|
| 0 | 0 | 0 | 0 | 0 | M111 | M11 | 3 | 3 | 0 |
| 0 | 0 | 0 | 0 | 1 | M111 | M10 | 3 | 2 | 1 |
| 0 | 0 | 0 | 1 | 0 | M111 | M01 | 3 | 1 | 2 |
| 0 | 0 | 0 | 1 | 1 | M111 | M00 | 3 | 0 | 3 |
| 0 | 0 | 1 | 0 | 0 | M110 | M11 | 7 | 3 | 4 |
| 0 | 0 | 1 | 0 | 1 | M110 | M10 | 7 | 2 | 5 |
| 0 | 0 | 1 | 1 | 0 | M110 | M01 | 7 | 1 | 6 |
| 0 | 0 | 1 | 1 | 1 | M110 | M00 | 7 | 0 | 7 |
| 0 | 1 | 0 | 0 | 0 | M101 | M11 | 11 | 3 | 8 |
| 0 | 1 | 0 | 0 | 1 | M101 | M10 | 11 | 2 | 9 |
| 0 | 1 | 0 | 1 | 0 | M101 | M01 | 11 | 1 | 10 |
| 0 | 1 | 0 | 1 | 1 | M101 | M00 | 11 | 0 | 11 |
| 0 | 1 | 1 | 0 | 0 | M100 | M11 | 15 | 3 | 12 |
| 0 | 1 | 1 | 0 | 1 | M100 | M10 | 15 | 2 | 13 |
| 0 | 1 | 1 | 1 | 0 | M100 | M01 | 15 | 1 | 14 |
| 0 | 1 | 1 | 1 | 1 | M100 | M00 | 15 | 0 | 15 |
| 1 | 0 | 0 | 0 | 0 | M011 | M11 | 19 | 3 | 16 |
| 1 | 0 | 0 | 0 | 1 | M011 | M10 | 19 | 2 | 17 |
| 1 | 0 | 0 | 1 | 0 | M011 | M01 | 19 | 1 | 18 |
| 1 | 0 | 0 | 1 | 1 | M011 | M00 | 19 | 0 | 19 |
| 1 | 0 | 1 | 0 | 0 | M010 | M11 | 23 | 3 | 20 |
| 1 | 0 | 1 | 0 | 1 | M010 | M10 | 23 | 2 | 21 |
| 1 | 0 | 1 | 1 | 0 | M010 | M01 | 23 | 1 | 22 |
| 1 | 0 | 1 | 1 | 1 | M010 | M00 | 23 | 0 | 23 |
| 1 | 1 | 0 | 0 | 0 | M001 | M11 | 27 | 3 | 24 |
| 1 | 1 | 0 | 0 | 1 | M001 | M10 | 27 | 2 | 25 |
| 1 | 1 | 0 | 1 | 0 | M001 | M01 | 27 | 1 | 26 |
| 1 | 1 | 0 | 1 | 1 | M001 | M00 | 27 | 0 | 27 |
| 1 | 1 | 1 | 0 | 0 | M000 | M11 | 31 | 3 | 28 |
| 1 | 1 | 1 | 0 | 1 | M000 | M10 | 31 | 2 | 29 |
| 1 | 1 | 1 | 1 | 0 | M000 | M01 | 31 | 1 | 30 |
| 1 | 1 | 1 | 1 | 1 | M000 | M00 | 31 | 0 | 31 |

Operation of ADC 26 is better understood by an example set forth in Table IV. Table IV shows a sequence of iterations with an "unknown" initial voltage of 17.4 volts stored on capacitor C1 for conversion to a digitally encoded output 19.

In steps 1–5, the MSB's are determined by maintaining the voltage at node N2 constant, and varying the voltage at node N1. The voltage at node N2, and hence the voltage on the lower element of capacitor C1, are held constant by maintaining all switching transistors associated with resistor array 18 in the off state, except one which remains in the on state. In the example here, switching transistor M00 remains in the on state to couple node N2 to the known potential of ground, although the invention is not limited thereto. The voltage at node N1 is varied by switching selective ones of transistors M000 through M111, typically systematically, to minimize the voltage difference between nodes N1 and N3.

The voltage difference between nodes N1 and N3 was minimized in iteration 4 and increased in iteration 5, causing output 34 of comparator 28 to change state. The minimum indicates the MSB bits have been determined. The switching transistors associated with the MSB array are returned to the state providing the minimum voltage difference between nodes N1 and N3. The voltage at node N1 is maintained constant and the voltage at node N2 is varied or perturbed by switching transistor M00 to the off state and one of the other transistors, such as transistor M01, to the on state in iteration 6. Transistor M01 switched to the on state increases the voltage at node N2 to 1 volt which decreases the voltage difference between nodes N1 and N3. In iteration 7 transistor M01 is switched to the off state and transistor M10 is switched to the on state which increases the voltage at node N2, and hence on the lower element of capacitor C1, to two volts. The voltage difference between nodes N1 and N3 is further reduced, but the voltage at node N3 is greater than the voltage at node N1 which causes output 34 of comparator 28 to change state. In iteration 8, the voltage at node N2 is increased to three volts which causes the voltage difference between nodes N1 and N3 to increase. The digitally encoded output 19 corresponding to an input of 17.4 volts as determined by ADC26 is thus the binary code 10001. The number of iterations in Table IV is illustrative only, in actual use, searches resulting in fewer iterations would be utilized.

In this manner, in the process of converting an analog signal having an unknown magnitude to a corresponding digitally encoded output, the voltage on both elements of capacitor C1 in ADC 26 are changed after initially storing the analog signal to be converted on capacitor C1.

Figure 3:
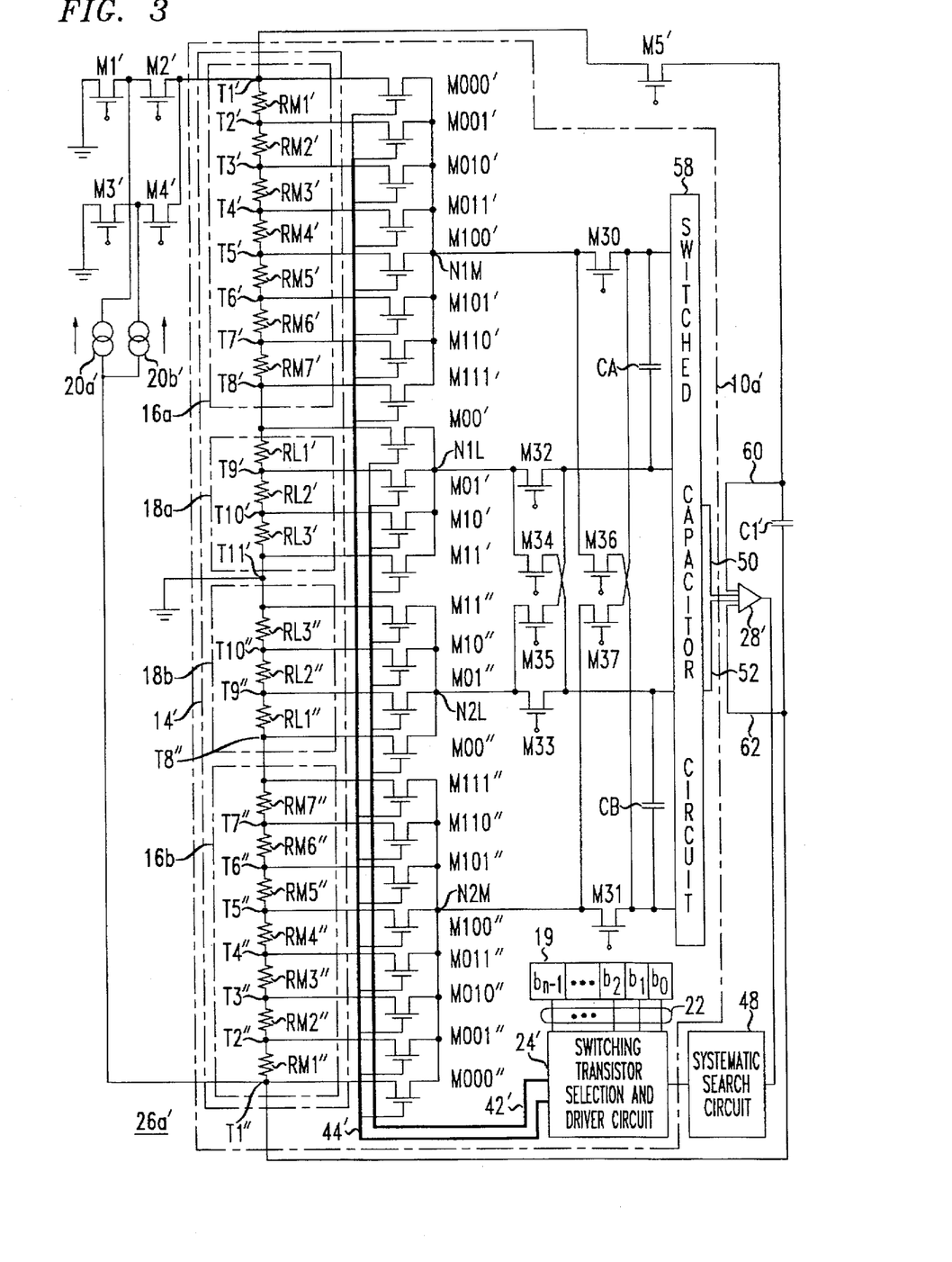
FIG. 3 is a schematic diagram of a differential mode current source driven analog-to-digital converter in accordance with an illustrative embodiment of the invention.
Figure 4:
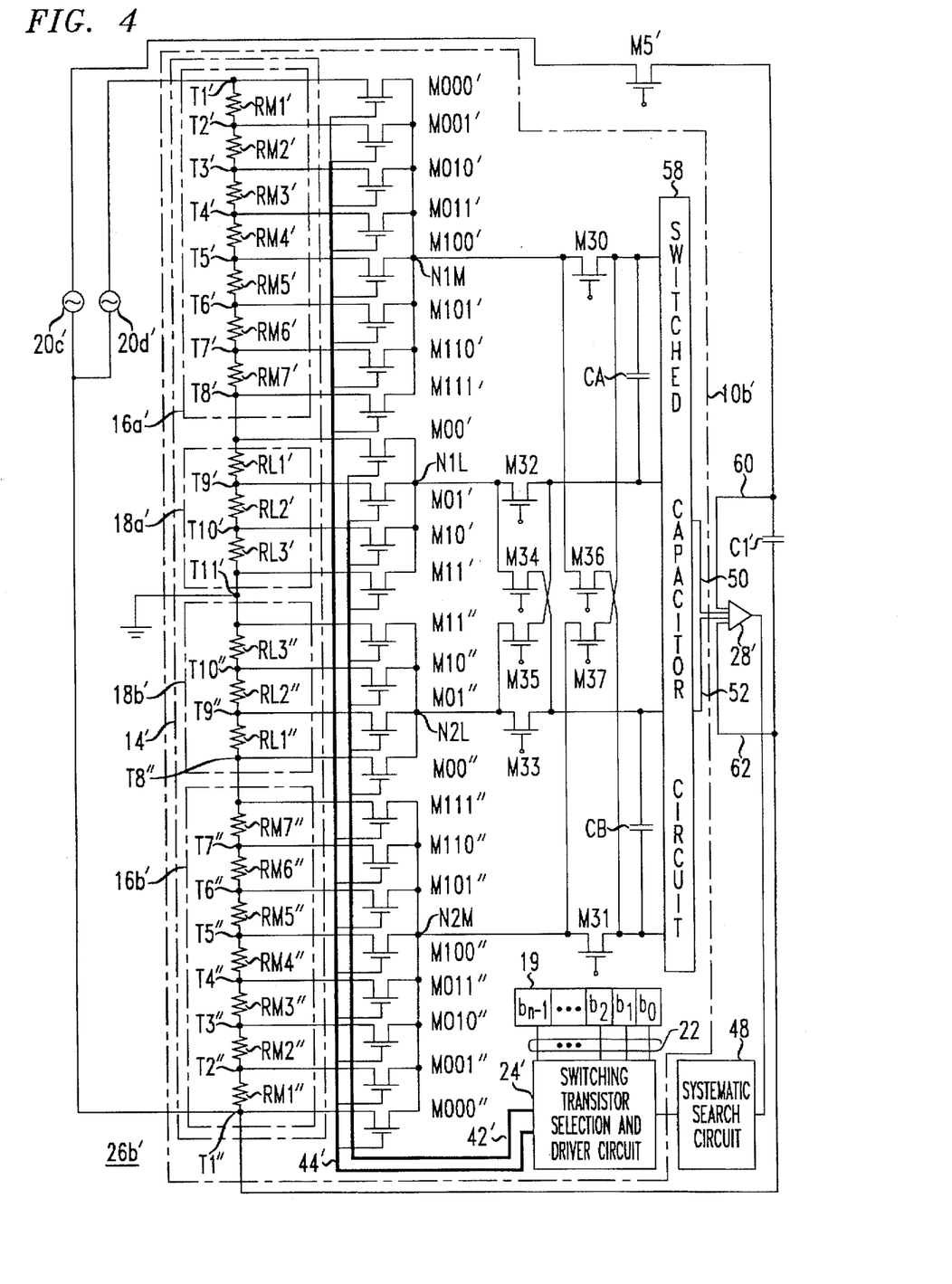
FIG. 4 is a schematic diagram of a differential mode analog-to-digital converter similar to FIG. 3, driven by a voltage source.

A schematic diagram of a five bit fully differential mode alternate embodiment ADC 26a' and 26b' incorporating a five bit fully differential mode DAC 10a' and 10b', is shown in FIGS. 3 and 4. FIG. 3 shows a current driven fully differential mode converter, whereas FIG. 4 shows a fully differential voltage driven converter. Elements providing functions similar to the function of elements in FIGS. 1 and 2 have the same reference numeral supplemented with a letter, prime, or letter and prime designations. Resistor string 14' illustratively has four arrays of resistors 16a, 16b, 18a and 18b. The middle intermediate tap (T11' in the illustrative embodiment) is coupled to a reference potential, such as but not limited to ground. Absent noise and with a constant current or voltage provided by power source 20a' or 20c' respectively, intermediate taps T1' through T10' operate at a positive voltage, intermediate tap T11' is maintained at a reference potential, and intermediate taps T10" through T1" operate at a negative voltage. To provide a fully differential analog voltage at outputs 50 and 52, switching transistors are turned on, by switching transistor selection and driver circuit 24', symmetrically about the intermediate tap coupled to a reference voltage, in the illustrative embodiment tap T11'. Whereas in the illustrative embodiment of DAC 10, a single switching transistor associated with each of the first and second arrays of resistors was switched to be in the on state to provide a differential analog voltage between nodes N1 and N2, in DAC 10a' transistors are switched to be in the on state in pairs symmetrically about the intermediate tap coupled to the reference potential. For example, if transistors M001' and M10' are switched to be in the on state, transistors M001" and M10" are also switched to be in the on state. If transistors M001' and M11" are switched to be in the on state to provide a fully differential analog output voltage at outputs 50 and 52, transistors M001" and M11" are also switched to be in the on state. It should be noted that it is not necessary for the pairs of switches, here transistors, be simultaneously switched to be in the on state. It is only necessary for the pairs of switches to be in the on state simultaneously. While a switching transistor selection and driver circuit is illustrated, more than one such circuit may be employed.

Multiple transistors on both the positive and negative voltage sides of resistor string 14' of differential mode DAC 10a' or DAC 10b' can be switched to be in the on state at the same time in accordance with the teaching of U.S. Pat. No. 5,604,501 entitled "Digital-to-Analog Converter with Reduced Number of Resistors", the disclosure of which is hereby incorporated by reference.

Transistors M30 and M36 are complimentary, as are transistors M32 and M34, M35 and M33, and M37 and M31. Transistors M30 and M36 conduct the output from resistor array 16a to either capacitor CA or CB. Similarly, transistors M32 and M34 conduct the output of resistor array 18a to either a second plate of capacitor CA or a second plate of capacitor CB. Transistors M33 and M35 conduct the output of resistor array 18b to either the first plate of capacitor CA or the first plate of capacitor CB. Transistors M31 and M37 conduct the output of resistor array 16b to either the second plate of capacitor CA or the second plate of capacitor CB. The process of switch selection for MSB bits and LSB bits is the same process as described above for FIGS. 1 and 2, except that in the case of the fully differential embodiment shown in FIGS. 3 and 4, complementary switches in arrays 16a and 16b are closed in determining the MSB bits and complementary switches in arrays 18a and 18b are closed in determining the LSB bits. The complementary switches need not be closed simultaneously; the output is evaluated after the complementary switches are closed.

Turning on switching transistors associated with resistor arrays 16a and 18a operating on the positive voltage side of resistor string 14', charges capacitor CA. With switching transistors M30 and M32 switched to be in the on state and switching transistors M34 and M36 switched to be in the off state, the switch in resistor array 16a that is switched to be in the on state couples to and provides a path for charging one plate of capacitor CA, whereas the switch associated with resistor array 18a that is switched to be in the on state couples to and provides a path for charging the other plate of capacitor CA. Similarly, with switches M31 and M33 switched to be in the on state and switching transistors M35 and M37 switched to be in the off state, turning on switching transistors associated with resistor arrays 16b and 18b operating on the negative voltage side of resistor string 14' charges capacitor CB. The switching transistor associated with resistor array 16b charges one plate of capacitor CB. The switching transistor associated with resistor array 18b couples to and provides a path for charging the other plate of capacitor CB. When charging of the capacitors is complete, the currents through the switches diminish to zero. Concomitantly, the voltage drop across each switch also decreases to zero, with the results that the converter operation is not affected by the switch resistance or switch nonlinearities as long as the switch remains closed until the current decreases to zero. The cross coupled pairs of switching transistors can be used by one skilled in the art to reverse the charges applied to capacitors CA and CB from resistor arrays 16a, 16b, 18a, and 18b.

Transistor M5' in conjunction with capacitor C1' form a sample and hold circuit to maintain a sampled analog signal on capacitor C1' during operation of ADC 26a' to determine a digitally coded representation of the sampled analog signal. With capacitors CA and CB charged, switched capacitor circuit 58 combines the charge stored on capacitors CA and CB, using switched capacitor techniques known by those skilled in the art, to provide fully differential analog outputs 50 and 52. Outputs 50 and 52 from switched capacitor circuit 58 provide two of the four inputs to differential comparator 28'. The other two inputs, 60 and 62, couple across capacitor C1' which is used to maintain the sampled analog signal for comparison during operation of ADC 26a'.

The converter shown in FIG. 4 is similar to the converter shown in FIG. 3, but is driven by a voltage source. In voltage mode, a reference voltage is applied across resistor string 14'. To achieve unity gain, the reference voltage is equal to the maximum expected output signal level (DAC operation) or the maximum expected input signal voltage level (ADC operation). Operation of DAC 10b' and ADC 26b' in the voltage mode should be readily understood by one skilled in the art in view of the above explanation of operation of DAC 10a' and ADC 26a' in the current mode. In voltage mode, switching transistors M1' through M4' shown in FIG. 3 are not necessary. In other respects, the converters shown in FIGS. 3 and 4 may be identical, i.e., 26a' may be identical to 26b', and 10a' may be identical to 10b'.

The resistors in resistor strings 14 and 14' are preferably fabricated of metal. The invention, however, is not limited thereto. The resistors may be fabricated at a predetermined level of integrated circuit fabrication. A resistor string may be fabricated of resistor materials such as doped or undoped polysilicon, metals such as aluminum or tungsten, or a layered combination of materials, such as for example polysilicon covered by metals such as aluminum or tungsten, or polysilicon covered by a nitride. Blanket layers may be deposited and then subsequently patterned in the shape desired.

The invention is particularly useful in communications systems and equipment employing integrated circuits in digital-to-analog and analog-to-digital converter applications where chip area and power dissipation is a concern.

While the illustrative embodiments of the invention have been described as having the LSB array of resistors on the low voltage reference side of the resistor string, the invention is not so limited. For example, the LSB array of resistors could be on the high voltage reference side of the resistor string in FIGS. 1 and 2. The LSB arrays of resistors in the fully differential embodiments shown in FIGS. 3 and 4 could just as well have been positioned at the outer ends of the resistor string. Also, while the resistor arrays have been illustrated as having a specific number of resistors, the invention is not limited thereto. Also, while the illustrative embodiments of the invention depicts a resistor array or arrays as the source of a voltage gradient, the voltage gradient could be generated by those skilled in the art by other known methods, including but not limited to, weighted capacitor arrays, and switched current sources.

The invention claimed is:

1. An integrated circuit including a subranging converter, comprising:

a resistor string comprising a plurality of resistors, the resistor string including first and second arrays of resistors for determining a predetermined number M of most significant bits, and third and fourth arrays of resistors for determining a predetermined number L of least significant bits, each of the first, second, third, and fourth arrays defining intermediate taps;

a first array of switching transistors coupled between respective intermediate taps in the first array of resistors and a first output node;

a second array of switching transistors coupled between respective intermediate taps in the second array of resistors and a second output node;

a third array of switching transistors coupled between respective intermediate taps in the third array of resistors and a third output node;

a fourth array of switching transistors coupled between respective intermediate taps in the fourth array of resistors and a fourth output node;

a first combining circuit for combining the voltage at the first and second output nodes, to be a combined first voltage;

a second combining circuit for combining the voltage at the third and fourth output nodes, to be a combined second voltage;

a capacitor having first and second terminals adapted to be selectively coupled across the resistor string;

a switch coupled to the first terminal of the capacitor, the switch capable of completing a circuit to charge the capacitor when in a first state; and a differential comparator having first, second, third and fourth input ports, the first input port coupled to the differential first voltage, the second input port coupled to the combined second voltage, the third input port coupled to the first terminal of the capacitor, the fourth input port coupled to the second terminal of the capacitor, the differential comparator providing an output signal that is indicative of the sign of the difference between the signals received at its first and third input ports and its second and fourth input ports.

2. An integrated circuit as recited in claim 1, wherein a resistor in the first array of resistors has a magnitude that is $2^L$ times larger than a resistor in the second array of resistors.

3. An integrated circuit as recited in claim 1, further comprising:

a systematic search circuit, the systematic search circuit receiving as an input the output signal from the differential comparator, the systematic search circuit coupled to a terminal of each of the plurality of switching transistors for selectively switching the switching transistors to a predetermined state, to produce a generated signal when the resistor string is energized by a power source, the systematic search circuit iteratively approximating an input signal and producing a digital representation thereof as an output.

4. An integrated circuit as recited in claim 1, wherein a resistor in one of said first or second arrays of resistors has a magnitude that is $2^L$ times larger than a resistor in one of said third or fourth arrays of resistors.

5. An integrated circuit including a subranging converter, comprising:

a resistor string comprising a plurality of resistors, the resistor string including first and second arrays of resistors for determining a predetermined number M of most significant bits, and third and fourth arrays of resistors for determining a predetermined number L of least significant bits, each of the first, second, third, and fourth arrays defining intermediate taps;

a first array of switching transistors coupled between respective intermediate taps in the first array of resistors and a first output node;

a second array of switching transistors coupled between respective intermediate taps in the second array of resistors and a second output node;

a third array of switching transistors coupled between respective intermediate taps in the third array of resistors and a third output node;

a fourth array of switching transistors coupled between respective intermediate taps in the fourth array of resistors and a fourth output node;

a combining circuit for combining the voltages at said output nodes to form a differential combined voltage;

a capacitor adapted to be selectively coupled to store a representative sample of an input signal applied to the converter; and a differential comparator having first, second, third and fourth input ports, the first and second input ports coupled to receive the differential combined voltage, the third and fourth input ports coupled to respective terminals of the capacitor, the differential comparator providing an output signal that is indicative of the sign of the difference between signals received at the first and third input ports and the second and fourth input ports.

6. An integrated circuit as recited in claim 5, wherein a current source providing a signal current is adapted to be coupled across the resistor string to develop a voltage across the resistor string due to the signal current flowing therethrough.

7. An integrated circuit as recited in claim 5, wherein a voltage source providing a voltage signal is adapted to be coupled to the capacitor to sample and hold a representative sample of the voltage signal.

8. An integrated circuit as recited in claim 5, wherein the combining circuit further comprises:

a first combining circuit for combining the voltage at the first and second output nodes, to be a combined first voltage; and a second combining circuit for combining the voltage at the third and fourth output nodes, to be a combined second voltage.

9. An integrated circuit as recited in claim 5, wherein a resistor in the first array of resistors has a magnitude that is $2^L$ times larger than a resistor in the second array of resistors.

10. An integrated circuit as recited in claim 5, further comprising:

a systematic search circuit, the systematic search circuit receiving as an input the output signal from the differential comparator, the systematic search circuit coupled to a terminal of each of the plurality of switching transistors for selectively switching the switching transistors to a predetermined state, to produce a generated signal when the resistor string is energized by a power source, the systematic search circuit iteratively approximating an input signal and producing a digital representation thereof as an output.

11. An integrated circuit including a subranging converter, comprising:

a resistor string comprising a plurality of resistors, the resistor string including first and second arrays of resistors for determining a predetermined number M of most significant bits, and third and fourth arrays of resistors for determining a predetermined number L of least significant bits, each of the first, second, third, and fourth arrays defining intermediate taps;

a first array of switching transistors coupled between respective intermediate taps in the first array of resistors and a first output node;

a second array of switching transistors coupled between respective intermediate taps in the second array of resistors and a second output node;

a third array of switching transistors coupled between respective intermediate taps in the third array of resistors and a third output node;

a fourth array of switching transistors coupled between respective intermediate taps in the fourth array of resistors and a fourth output node;

a combining circuit for combining the voltages at said output nodes to form a differential combined voltage; and a differential comparator having first, second, third and fourth input ports, the first and second input ports coupled to receive the differential combined voltage, the third and fourth input ports coupled to a sample and hold circuit, the differential comparator providing an output signal that is indicative of the sign of the difference between signals received at the first and third input ports and the second and fourth input ports.

12. An integrated circuit as recited in claim 11, further comprising:

a sample-and-hold circuit coupled to the differential comparator, the sample-and-hold circuit adapted to receive and store a representative sample of an input signal applied to the converter.

13. An integrated circuit as recited in claim 11, wherein a current source providing a signal current is adapted to be coupled across the resistor string to develop a voltage across the resistor string due to the signal current flowing therethrough.

14. An integrated circuit as recited in claim 12, wherein a voltage source providing a voltage signal is adapted to be coupled to the sample-and-hold circuit to sample and hold a representative sample of the voltage signal.

15. An integrated circuit as recited in claim 11, wherein the combining circuit further comprises:

a first combining circuit for combining the voltage at the first and second output nodes, to be a combined first voltage; and a second combining circuit for combining the voltage at the third and fourth output nodes, to be a combined second voltage.

16. An integrated circuit as recited in claim 11, wherein a resistor in the first array of resistors has a magnitude that is $2^L$ times larger than a resistor in the second array of resistors.

17. An integrated circuit as recited in claim 11, further comprising:

a systematic search circuit, the systematic search circuit receiving as an input the output signal from the differential comparator, the systematic search circuit coupled to a terminal of each of the plurality of switching transistors for selectively switching the switching transistors to a predetermined state, to produce a generated signal when the resistor string is energized by a power source, the systematic search circuit iteratively approximating an input signal and producing a digital representation thereof as an output.

* * * * *